United States Patent
Manda

(10) Patent No.: US 9,516,777 B2
(45) Date of Patent: Dec. 6, 2016

(54) RACK MODULE

(76) Inventor: Ion Manda, Greater London (GB)

( * ) Notice: Subject to any disclaimer, the term of this patent is extended or adjusted under 35 U.S.C. 154(b) by 153 days.

(21) Appl. No.: 14/116,920

(22) PCT Filed: May 10, 2012

(86) PCT No.: PCT/GB2012/051028
§ 371 (c)(1),
(2), (4) Date: Nov. 11, 2013

(87) PCT Pub. No.: WO2012/153141
PCT Pub. Date: Nov. 15, 2012

(65) Prior Publication Data
US 2014/0055959 A1   Feb. 27, 2014

(30) Foreign Application Priority Data
May 11, 2011   (GB) .................................. 1107860.7

(51) Int. Cl.
| H05K 5/00 | (2006.01) |
| H05K 7/14 | (2006.01) |
| G11B 33/12 | (2006.01) |
| H05K 7/16 | (2006.01) |

(52) U.S. Cl.
CPC .............. H05K 7/14 (2013.01); G11B 33/128 (2013.01); H05K 7/1487 (2013.01); H05K 7/16 (2013.01)

(58) Field of Classification Search
USPC ........... 361/727–730, 756, 679.39, 741, 725; 211/181.1, 126.1, 150, 59.2
See application file for complete search history.

(56) References Cited

U.S. PATENT DOCUMENTS

| 2,566,064 | A | | 8/1951 | Keim |
| 3,586,410 | A | * | 6/1971 | Barrow .......................... 312/323 |
| 5,506,750 | A | | 4/1996 | Carteau et al. |
| 5,584,396 | A | | 12/1996 | Schmitt |
| 6,535,391 | B2 | * | 3/2003 | Larsen et al. .................. 361/727 |
| 6,621,693 | B1 | * | 9/2003 | Potter et al. ............. 361/679.33 |
| 6,788,544 | B1 | * | 9/2004 | Barsun et al. ................. 361/727 |
| 6,826,055 | B2 | * | 11/2004 | Mease et al. .................. 361/725 |
| 6,988,626 | B2 | * | 1/2006 | Varghese et al. ............... 211/26 |
| 6,999,306 | B2 | | 2/2006 | Walczak et al. |
| 7,042,721 | B2 | * | 5/2006 | Olesiewicz ............. G06F 1/187 312/223.2 |
| 7,474,229 | B2 | * | 1/2009 | Franz et al. ................ 340/815.4 |
| 7,724,543 | B2 | * | 5/2010 | Ozawa et al. ................. 361/826 |
| 8,120,922 | B2 | * | 2/2012 | Randall ................ G11B 33/126 361/725 |

(Continued)

FOREIGN PATENT DOCUMENTS

| CN | 1722555 A | 1/2006 |
| DE | 1183157 | 12/1964 |

(Continued)

OTHER PUBLICATIONS

International Search Report for PCT/GB2012/051028, Completed by the European Patent Office on Oct. 1, 2012, 4 Pages.

*Primary Examiner* — Hung S Bui
(74) *Attorney, Agent, or Firm* — Harness, Dickey & Pierce, P.L.C.

(57) ABSTRACT

A module for mounting in a rack, the module including a frame and a tray, the frame being arranged such that it may be mounted to the rack, and the tray being slidably and pivotably connected to the frame, such that the tray may be moved between a first position, in which the tray is received within the frame and lies substantially parallel to the frame, and a second position, in which the tray lies outside the frame and at an angle to the frame.

22 Claims, 12 Drawing Sheets

(56) References Cited

U.S. PATENT DOCUMENTS

| | | | |
|---|---|---|---|
| 8,538,226 B2 * | 9/2013 | Makrides-Saravanos | G02B 6/4455 385/135 |
| 8,797,732 B2 * | 8/2014 | Ganta Papa Rao Bala | 361/679.32 |
| 2002/0171334 A1 * | 11/2002 | Pinheiro | 312/223.1 |
| 2003/0149840 A1 | 8/2003 | Bolt et al. | |
| 2006/0010456 A1 * | 1/2006 | Ishimine et al. | 720/600 |
| 2006/0133050 A1 | 6/2006 | Matsumoto et al. | |
| 2007/0115627 A1 | 5/2007 | Carlisi et al. | |
| 2007/0230111 A1 | 10/2007 | Starr et al. | |
| 2008/0106871 A1 * | 5/2008 | James | H04Q 1/023 361/727 |
| 2010/0061064 A1 | 3/2010 | Murano et al. | |

FOREIGN PATENT DOCUMENTS

| | | |
|---|---|---|
| DE | 3426102 | 1/1986 |
| DE | 202010007778 | 10/2010 |
| FR | 2622365 | 4/1989 |
| JP | 2000348475 A | 12/2000 |
| JP | 2003036669 A | 2/2003 |
| JP | 2006024283 A | 1/2006 |

* cited by examiner

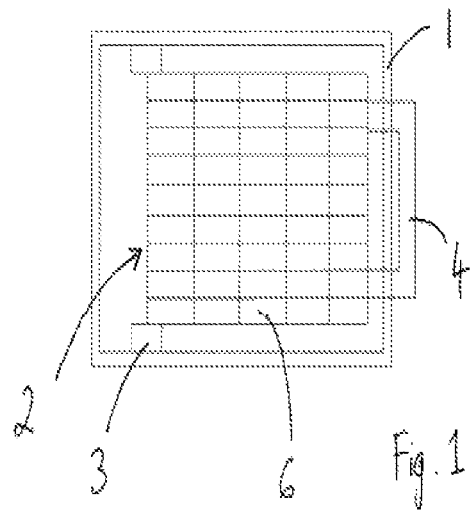
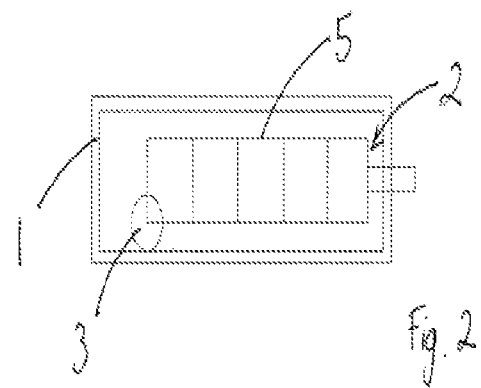
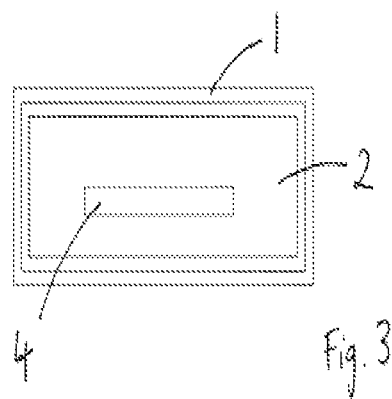

RACK MODULE

CROSS-REFERENCE TO RELATED APPLICATION

This application is the U.S. national phase of PCT Application No. PCT/GB2012/051028 filed on May 10, 2012, which claims priority to Great Britain Patent Application No. 1107860.7 filed on May 11, 2011, the disclosures of which are incorporated in their entirety by reference herein.

The present disclosure relates to a rack module. In particular, it relates to a rack module for electronic hardware, such as computer server equipment and in particular hard disk drives.

BACKGROUND TO THE INVENTION

For a number of years racks have been used for mounting electronic equipment modules including, but not limited to, computer server equipment. Such racks are standardized frames or enclosures that allow for the mounting of multiple equipment modules.

Commonly these racks comply to a 19-inch rack standard, wherein each module has a front panel that is 19 inches (482.6 mm) wide, including edges or ears that protrude on each side to allow the module to be fastened to the rack frame with screws. The height of the electronic modules is standardized as multiples of 1.75 inches (44.5 mm) or one rack unit (U).

The use of racks with computer server equipment is particularly favourable, since it allows for dense hardware configurations without occupying excessive floor space or requiring shelving.

Equipment which is commonly accessed for servicing may be mounted via rails (or slides) rather than directly to the rack, wherein the equipment module may slide into the rack along the supporting rails.

Whilst such rail mounted equipment provides improved accessibility for inspection or maintenance, there remains an access problem when the equipment is mounted high up, particularly when it is mounted above a user's eye level.

US2006/0010456 describes a rack mount type storage unit, which is stated as enabling easy access to recording disk drives. In this unit a plurality of frame members are provided within a support cabinet. Each frame member is essentially a drawer provided on rails, which permit the frame member to slide out of the support cabinet. Each frame member is attached to these rails, which are provided on guide rails within the support cabinet. The frame member and its rails slide out of the cabinet and the frame member can then pivot about support shafts that are attached to, and perpendicular to, the rails. There are restraint members provided that mean that once the frame member has been pulled out and allowed to rotate round the frame member is then stopped at a predetermined angle. The recording disk drives are held within the frame members in an upright attitude and can be removed from the frame members once they have slid out and pivoted to an angled position.

FR2622365 relates to a product that has a number of modules, each containing electrical or electronic equipment. Each module has a drawer in a support rack and the drawer can rotate about a pivot point located at the middle of the drawer. The modules are shown mounted onto an elongate support.

DE3426102 describes a cabinet that houses a mounting rack on rails. Components are placed in the mounting rack. The mounting rack is provided on guide rails which permit the rack to slide out of the cabinet. The mounting rack and its rails slide completely out of the cabinet and then the mounting rack can pivot about bolts attached to the rails. Once the mounting rack has been pivoted it can be removed and replaced.

U.S. Pat. No. 2,566,064 relates to a cabinet for holding high frequency apparatus. The chassis in the cabinet is slid out and then rotatably moved between different angled positions on a slide arm made up of telescoping channel members. The pivoting of the chassis is about a pivot point on the slide arm, which is located outside the frame when the rotation occurs. The chassis is moved out and rotated to allow access to controls behind the chassis.

US2010/061064 relates to a copper patching assembly that has a shallow tray with patch-ports mounted thereon. This tray can be slid out of the assembly on a sliding track that is located mid-way up the height of the frame. The tray is then tilted up or down to facilitate access to the top face of the tray, with the tray being pivoted about pins on the sliding track.

DE1183157 describes a cabinet that has pull-out drawers which can slide out and then pivot downwards. The pivoting is about the axis of locking bolts.

The present invention arose in a bid to provide an improved rack module.

SUMMARY OF THE INVENTION

According to the present invention, in a first aspect, there is provided a module for mounting in a rack, comprising a frame and a tray, the frame being arranged such that it may be mounted to the rack, and the tray being slidably and pivotably connected to the frame, such that the tray may be moved between a first position, in which the tray is received within the frame and lies substantially parallel to the frame, and a second position, in which the tray lies outside the frame and at an angle to the frame.

The invention also provides, in a second aspect, a rack unit comprising a rack provided with one or more modules of the first aspect of the invention. The rack unit therefore comprises a rack and one or more of the modules of the first aspect, with the modules being mounted in the rack. The mounting of the modules in the rack is by the frame of the module being mounted to the rack.

The invention also provides, in a third aspect, a hard disk drive unit that comprises a rack unit in accordance with the second aspect, wherein one or more of the modules has hard disk drives located in its tray. Preferably each of the modules has hard disk drives located in its tray.

The module of the present invention differs from the products of the prior art in that it comprises a frame and a tray within that frame, with the tray being moveable relative to the frame, and with the overall module of frame plus tray then being able to be mounted within a rack. The module that includes both a frame and a tray is therefore self-contained and can be removed from within the rack. Many of the prior art products simply involve a moveable drawer within a rack/cabinet, with the drawer being moveable with respect to that rack/cabinet.

The use of the module of the invention is beneficial in that the module is a discrete unit that can be provided separately and replaced readily. The provision of one or more individual modules within a rack to form a rack unit, wherein the equipment provided in the rack unit is located within the slidably and pivotably moveable tray(s) of the module, means that the tray can be designed for ease of access to the equipment —which is relevant when the equipment is to be serviced, replaced or the like—whilst the module overall (frame plus tray) can be designed to meet criteria relevant to normal use, such as security and ease of cooling the equipment/temperature control.

The prior art did not recognise that having a multi-component module mounted in a rack would provide this flexibility in terms of meeting both desired criteria for normal use and desired criteria for servicing/access to the equipment in the rack.

The present invention permits quick access to the equipment provided within the rack unit, without needing the rack module, as secured to the rack, to be removed. Instead, the frame of the rack module stays secured to the rack and the tray is simply slid out and pivoted down to allow access to the equipment.

The module of the invention can be provided with hard drive disks in its tray and can then stand alone as a computer case for a desktop computer, as well as being able to be provided in a rack.

STATEMENTS OF CERTAIN OPTIONAL/PREFERRED FEATURES

In one embodiment the tray comprises an upper face, which is arranged to lie parallel to the plane of the frame, when the tray is in the first position, and to lie at an angle to the plane of the frame and to face outwards from the frame, when the tray is in the second position, and wherein the tray is arranged such that components mounted within the tray are accessible from the upper face. It may be that the tray is arranged such that the components may be removed from the upper face.

In one embodiment the tray is arranged such that, in the second position, the tray lies perpendicular to the frame.

In one embodiment one or more hot swappable electronic components are mounted within the tray.

In one embodiment the module is a hard disk array comprising a plurality of hard disk drives.

In one embodiment the tray comprises a plurality of compartments, each compartment being provided to removably support an electronic component and to provide the necessary connections to the component. In one such embodiment the module is a hard disk array comprising a plurality of hard disk drives and each compartment is arranged to receive a hard disk drive, supporting the hard disk drive therein and providing the necessary power and data connections to the hard drive.

In one embodiment the frame is arranged to be mounted in a 19 inch rack. It may be that the frame has a height of 1 U or a multiple thereof.

DETAILED DESCRIPTION OF THE INVENTION

The module of the invention is for mounting in a rack. The rack unit of the invention is a rack provided with one or more modules of the invention. The rack unit therefore comprises a rack and one or more of the modules of the invention, with the modules being mounted in the rack. The mounting of the modules in the rack is by the frame of the module being mounted to the rack.

In one embodiment the rack comprises at least one cavity within which a module of the first aspect of the invention can fit. Preferably the rack comprises two or more such cavities, such as three or more, four or more, five or more, six or more, seven or more, eight or more, nine or more, or ten or more cavities. The cavities may be shaped and sized to receive a single module of the invention, or they may be shaped and sized to receive more than one module of the invention, such as two modules, three modules, four modules, or more.

In one embodiment the rack is provided with a top surface, a bottom surface, a left hand side wall and a right hand side wall. Optionally it may have a back wall. There may suitably be one or more shelves (e.g. two or more shelves or three or more shelves) provided between the top surface and the bottom surface.

There may optionally be one or more dividing walls (e.g. two or more dividing walls or three or more dividing walls) provided between the left hand wall and the right hand wall.

Preferably the walls and surfaces define a number of cavities, wherein the cavities are shaped and sized to be able to receive a module of the first aspect of the invention can fit. Preferably there are two or more such cavities, such as three or more, four or more, five or more, six or more, seven or more, eight or more, nine or more, or ten or more cavities. The cavities may be shaped and sized to receive a single module of the invention, or they may be shaped and sized to receive more than one module of the invention, such as two modules, three modules, four modules, or more.

In the event that the cavities are shaped and sized to receive more than one module of the invention, they may be such that two or more modules can be stacked on top of each other and/or they may be such that two or more modules can be located side by side (in parallel).

The rack may suitably be a rack for mounting electronic equipment modules including, but not limited to, computer server equipment and in particular hard disk drives. Such racks are standardized frames or enclosures that allow for the mounting of multiple equipment modules.

The rack may, in one embodiment, comply to a 19-inch rack standard, wherein the rack has cavities and each cavity can receive a module that has a front panel that is 19 inches (482.6 mm) wide, including edges or ears that protrude on each side to allow the module to be fastened to the rack frame with screws.

The rack may, in one embodiment, be such that each cavity can receive a module with a height that is a multiple of 1.75 inches (44.5 mm), i.e. one rack unit (U). For example, each cavity may be sized to receive a module with a height that is 1 U, 2 U, 3 U or 4 U.

Preferably the rack has cavities that each have a height that is a multiple of 1.75 inches (44.5 mm), i.e. one rack unit (U). For example, each cavity may have a height that is 1 U, 2 U, 3 U or 4 U. The skilled reader will appreciate that some degree of tolerance in this height may, however, be acceptable, and thus the height might not be an exact multiple of one rack unit. The degree of tolerance may be e.g. ±15%, or ±10%, or ±5%.

In one embodiment the modules are sized so that more than one module fits across the width of the rack. For example, it may be that the modules each have a width such that two or more, three or more or four or more modules fit across the width of the rack. These modules may therefore be provided side-by-side in the rack (in parallel).

In another embodiment the modules are sized so that only one module fits across the width of the rack.

In one embodiment the modules are sized to each have a width of 19 inches. In particular each module may have a front panel that is 19 inches (482.6 mm) wide, including edges or ears that protrude on each side to allow the module to be fastened to the rack frame with screws.

Each module comprises a frame and a tray, the frame being arranged such that it may be mounted to the rack, and the tray being slidably and pivotably connected to the frame, such that the tray may be moved between a first position, in which the tray is received within the frame and lies substantially parallel to the frame, and a second position, in which the tray lies outside the frame and at an angle to the frame.

It is envisaged that each module suitably comprises only one frame. However, each module may comprise a single tray or more than one tray (such as two trays). In the event that there is more than one tray in a module it is envisaged that these will be located side by side, such that the trays are parallel to each other, and each may be moved between a first position, in which the tray is received within the frame and lies substantially parallel to the frame, and a second position, in which the tray lies outside the frame and at an angle to the frame. In one embodiment each module comprises a single frame and one or two or three or four trays.

It is preferred that the modules are such that there is more than one tray across the width of the rack. This may be (i) by virtue of there being more than one module across the width of the rack, or (ii) by virtue of there being more than one tray across the width of each module, or both (i) and (ii). In one embodiment it is by virtue of there being more than one tray across the width of each module.

It is beneficial to use a design where there are multiple trays across the width of the rack, as this allows the weight of the contents (e.g. hard disk drives) to be spread over these trays rather than there being a single drawer across the width of the module which contains a significantly greater weight of products.

For example, a tray containing a few disks will usually weigh around 2 to 3 kg (although it will be appreciated by the skilled reader that the exact size of the trays can be designed as required, and therefore the size and maximum weight of each tray can be customised). This contrasts with conventional disk arrays (i.e. the whole rack module) which are quite heavy, weighing of the order of 50 kg.

It is therefore easier to manipulate a tray, e.g. in terms of moving it in and out as required and being able to bear its weight more readily when required during use. Therefore as compared to prior art systems, where a large drawer takes up the entire width of the rack or cabinet, and therefore can contain significant weight, there is a clear benefit.

The tray arrangement of the present invention also allows for greater ease of handling due to the fact that the width of each tray will be less than the width of drawers in known units, and therefore it is easier for an individual to move the tray as required in a controlled fashion.

There are also fewer (or no) health and safety issues to be considered with moving a considerably lower weight item.

In addition, the mechanism that permits movement of the tray in and out of the frame is easier to construct because of the reduced weight.

The invention is also beneficial in that less space is required in front of the rack unit to access the equipment in the rack unit, due to only the tray portion of the rack module moving, in a sliding and pivoting fashion, when compared to needing to slide out an entire drawer/rack module to access the equipment.

Preferably, the module of the invention forms a closed box when the tray is in its first position, in which the tray is received within the frame and lies substantially parallel to the frame. Therefore in this configuration any faces of the frame(s) that are open are covered by surfaces of the tray(s).

For example, it may be that the frame is a box shape but with an open end, which in use allows movement of the tray between its first and second positions, and that when the tray(s) are in the first position front wall(s) of the tray(s) cover the open end, so that the module forms a closed box.

It is preferred that the frame is not itself a closed box. It is also preferred that the tray is not itself a closed box. Thus the frame and the tray preferably each have at least one open face. However, when the tray is provided in the frame these open faces do not overlap, and thus a closed box is formed.

In one embodiment the tray is open at least on its upper face. This is beneficial in allowing access to the equipment provided in the tray.

In one embodiment the frame is open at least one end. This therefore allows the movement of the tray in and out of the frame, between the first and second positions.

When the tray and frame are combined, however, with the tray in its first position, the resultant module of the invention forms a closed box.

Some prior art devices simply provide an open drawer to hold the contents, e.g. hard disk drives. Therefore there is at least an upper surface that is not covered.

The present invention is beneficial because by having a closed configuration the module presents less electrical hazard, hence it is suitable for end users. Equally there are no (or fewer) health and safety issues as consideration does not have to be given to openly accessibly electrical components. A product that is based on a drawer type arrangement, which is therefore open all the time at its upper surface, means that the risk of accidents/malfunctions is greater and the product will not be appropriate for less specialised/well trained end users.

The design is also less accident prone due to providing a fully enclosed configuration, and is more durable in production.

In addition, the provision of an enclosed configuration for the module allows more efficient cooling of the components (e.g. hard disk drives), and hence better energy efficiency and longer life for the components. Achieving sufficient cooling so as to ensure optimal work temperature is one of the most critical aspects of rack modules for mounting electronic equipment such as computer server equipment.

In one embodiment the tray is separate from, or separable from, the sliding mechanism, that permits the tray to move slidably as part of its movement between its first position and its second position. For example, the sliding mechanism (such as rails) may be provided on the frame rather than the tray, or may be provided on, but detachable from, the tray.

This arrangement can be beneficial because the tray can then in itself be a smaller modular unit that can be removed and replaced as required. When the tray contains hard drive disks it is essentially a larger virtual hard disk, The tray may for example contain two or more hard drive disks, e.g. three or more, four or more, five or more, six or more, seven or more, eight or more, nine or more, or ten or more disks.

In one embodiment the tray is moveable to a second position that is substantially perpendicular to the frame (i.e. an angle close to 90 degrees, such as from 90 to 100 degrees or from 90 to 95 degrees; preferably from 90 to 93 degrees or from 90 to 92 degrees or from 90 to 91 degrees). This offers optimal access to the equipment when the rack is tall. When reference is made to the angle of the tray to the frame it will be understood by the skilled reader that reference is being made to the angle between the bottom surface of the frame (that is, the surface that is lowermost in use) and the bottom surface of the tray (that is, the surface that is lowermost when the tray is in the first position).

In some embodiments, the tray is moveable to a second position that is at an oblique angle to the frame. For example, the angle may be from 95 to 170 degrees, preferably from 100 to 165 degrees, such as from 105 to 160 degrees or from 110 to 150 degrees.

It may be that the tray is provided with a support leg. The leg may be located such that when the tray is in its second position the leg contacts an outer surface of the rack. The leg may extend from the bottom surface of the tray (that is, the surface that is lowermost in use when the tray is in its first position). The leg may be located at or near to the front face of the tray (that is, the face of the tray that faces out of the rack in use when the tray is in its first position).

This leg may be of a fixed length or may be extendable, e.g. it may be telescopic. The leg may have a fixed orientation or it may be moveable (e.g. pivotable) between orientations. For example, it may lie flat against the bottom surface of the tray (that is, the surface that is lowermost in use when the tray is in its first position) when the tray is in the first position and then the user may choose to pivot the leg, so that it can extend outwardly from the bottom surface of the tray, when the tray is in its second position. Of course, the user might also choose to leave the leg lying flat against the bottom surface in that second position as well.

The leg can be used to prevent the tray from accidentally hitting anything behind it. The leg may be used to slightly angle the tray when it is in the second position.

The tray may move slidably out of the frame, and slidably back into the frame, by the use of any sliding mechanism.

It is preferred that the sliding mechanism is located on the bottom surface of the tray and/or on the inside of the frame for engagement with the bottom surface of the tray.

In one embodiment, the sliding mechanism involves the provision of bearing means, such as wheels, castors, rollers or the like. These are preferably provided on the bottom surface of the tray. However it could also be envisaged that they are provided on the inside of the frame for engagement with the bottom surface of the tray.

In one embodiment rails or grooves or tracks or other guide means are also provided, to assist the sliding of the tray. In the event that the bearing means, such as wheels, castors, rollers or the like, are provided on the bottom surface of the tray the guide means are provided on the inside of the frame for engagement with the bearing means. In the event that the bearing means, such as wheels, castors, rollers or the like, are provided on the inside of the frame the guide means are provided on the bottom surface of the tray for engagement with the bearing means.

The use of a sliding mechanism located beneath the tray (either on the bottom surface of the tray and/or inside the frame for engagement with the bottom surface of the tray is more efficient in terms of space. It avoids the need for the tray to be longer than the frame, as would be required by using slides located on the sides of the tray.

The use of a sliding mechanism located beneath the tray also minimises the travelling distance of any connecting cable that connect equipment within the tray with other equipment or with a power source. The connecting cables will not need to extend beyond the inside of the frame.

The tray may pivot with respect to the frame by the use of any pivoting mechanism.

It is preferred that the pivoting mechanism involves pivoting about a bearing means, such as a wheel, castor, roller or the like.

Preferably the position of the pivot is either vertically aligned with or behind the back edge (that is, the edge of the tray that faces into the rack, in use when the tray is in its first position) of the top surface of the tray (that is, the surface that is uppermost in use when the tray is in its first position).

In one embodiment the position of the pivot is at the back edge of the bottom surface of the tray.

The provision of the pivot point at a location that is aligned with or behind the top surface of the tray allows efficient use of the space. This is because the frame then does not need to have a greater height than the tray allow enough space for the pivoting action.

Preferably the pivoting action occurs at or near the open front face of the frame (that is the face of the frame that faces out of the rack, in use),In particular the pivoting action may suitably occur at or near the edge where the open front face of the frame meets the bottom surface of the frame.

The back surface of the tray (that is, the surface of the tray that faces into the rack, in use, when the tray is in its first position) may be perpendicular to the bottom surface of the tray.

However, in a preferred embodiment the back surface is at an oblique angle to the bottom surface of the tray, e.g. at an angle of from 40 to 85 degrees, such as from 45 to 75 degrees, preferably from 50 to 70 degrees. Thus the back edge of the bottom surface of the tray is located behind (further into the rack) the back edge of the top surface of the tray. The use of an angled back brings more structural integrity.

The tray may be provided with a locking mechanism to secure it in the first position. The user can then unlock the locking mechanism when it is desired to move the tray into the second position. The use of a locking mechanism prevents the tray from sliding out accidentally. Any known locking mechanism may be used, such as a locking mechanism based on male and female connectors (e.g. holes and lugs) that can be engaged together and released apart as required.

Preferably, the tray comprises an upper face, which is arranged to lie parallel to the plane of the frame, when the tray is in the first position, and to lie at an angle to the plane of the frame and to face outwards from the frame, when the tray is in the second position, and wherein the tray is arranged such that components mounted within the tray are accessible from the upper face. Preferably, the components may be removed and/or inserted from the upper face.

Most preferably, the tray is arranged such that, in the second position, the tray lies perpendicular to the frame. The tray may be arranged such that it can be locked at any desired angle between the first and second positions.

One or more hot swappable electronic components may be mounted within the tray. Preferably, the module is a hard disk array comprising a plurality of hard disk drives.

The tray may comprises a plurality of compartments, each compartment being provided to removably support an electronic component and to provide the necessary connections to the component. Each compartment may be arranged to receive a hard disk drive, supporting the hard disk drive therein and providing the necessary power and data connections to the hard drive. The compartments, preferably, being accessible from the upper face as described above.

The frame may be arranged to be mounted in a 19 inch rack. The frame may have a height of 1 U or a multiple thereof, i.e. 2 U, 3 U, 4 U, etc.

The frame may receive more than one tray. A plurality of trays may be provided in each frame in a side by side and/or stacked arrangement.

According to the present invention, in a further aspect, there is provided a rack, which houses one or more modules as recited in any of the statements above.

DESCRIPTION OF THE DRAWINGS

Non-limiting embodiments will now be described, by way of example only, with reference to the accompanying drawings, in which:

FIG. 1 shows a plan view of a rack module in a first, closed, position;

FIG. 2 shows a partially cutaway side view of the rack module in the first position;

FIG. 3 shows a front view of the rack module in the first position;

Referring to FIGS. 1 to 6, there is shown a rack module according to a first embodiment.

Figure 4:
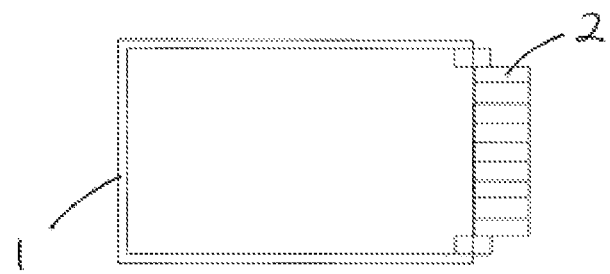
FIG. 4 shows a plan view of the rack module in a second, open, position.
Figure 5:
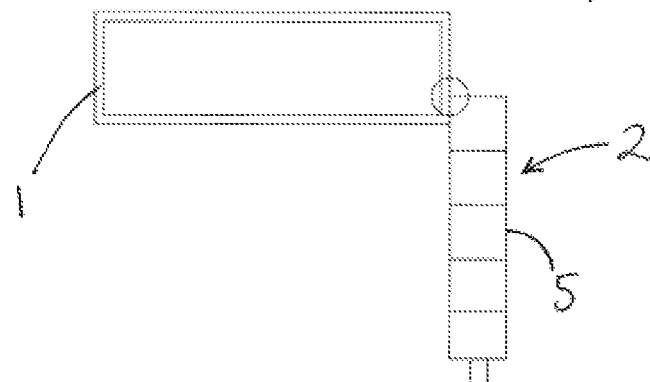
FIG. 5 shows a partially cutaway side view of the rack module in the second position.
Figure 6:
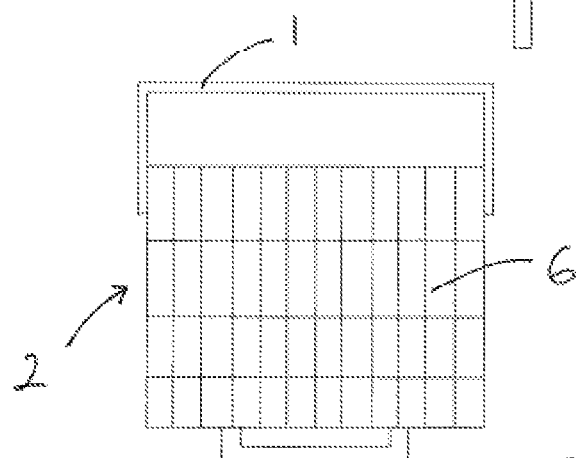
FIG. 6 shows a front view of the rack module in the second position.
Figure 7:
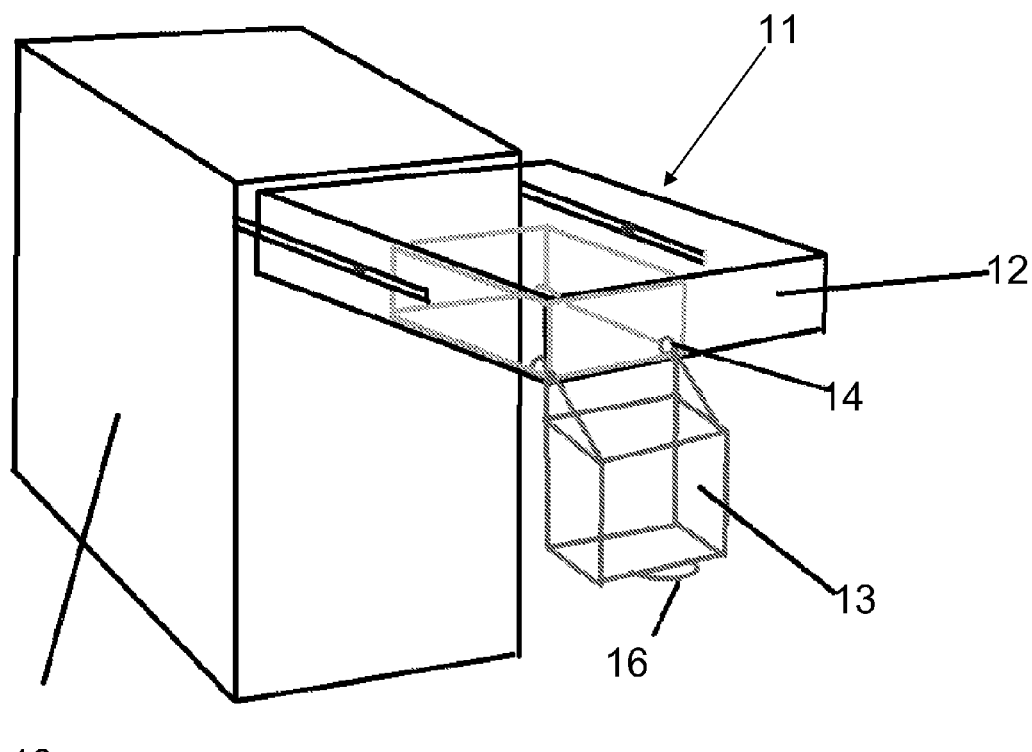
FIG. 7 shows a an exploded perspective view of a second embodiment of the rack module, to illustrate the rack module and the rack in which it is mounted.

The rack module comprises a frame 1 and a tray 2. The frame is arranged such that it may be mounted to a rack (not shown). The tray is slidably and pivotably mounted to the frame, such that the tray may be moved between a first, closed, position (as shown in FIGS. 1 to 3) and a second, open, position (as shown in FIGS. 4 to 6).

In the first position, the tray is received within the frame and lies substantially parallel to the frame, which is preferably mounted in the rack such that it is horizontal in use. In the second position, the tray lies outside the frame and at an angle to the frame. Here, in the second position, the tray lies perpendicular to the frame, however, in alternative embodiments, it may be arranged to lie at an oblique angle to the frame. The tray may be arranged such that it may be locked at a range of angles between an extended parallel position and the perpendicular position depicted.

The frame is preferably arranged to fit within a standard 19 inch frame rack. Frames, and thereby trays, of various depths are possible. The depth of the frame will be largely dependent on the components that the tray is arranged to receive. To conform to the 19 inch rack standard, the frame will have a minimum depth of 1 U (1.75 inches (44.5 mm)). It may, however, have a depth of multiple Us, i.e. 2 U, 3 U, 4 U, etc.

The frame is preferably provided with edges or ears (not shown) that protrude on its vertically extending front side edges to allow the module to be fastened 5 to a rack with screws in the conventional manner.

The frame may take any suitable form that allows it to be retained within a rack and to slidably and rotatably receive the tray. The frame, as depicted, is preferably substantially rectangular.

The frame, as discussed, receives the tray. Most preferably, the tray is connected to the frame via slide rails, which permit a sliding movement between the tray and the frame, i.e. reciprocal motion in the plane of the frame with the tray and the frame parallel to one another, and a pivotal movement between the tray and the frame, i.e. rotary motion to place the tray at an angle to the plane of the frame. The arrangement is such that pivotal movement is only possible once the tray has been slid to lie outside the frame.

Any suitable connecting mechanism may be implemented that permits such movement. In the figures, the connecting mechanism 3 is shown as a wheel mechanism.

An exemplary connecting mechanism comprises first, second, third and fourth pairs of slide rail members. The first slide rail members are fixed to the frame and are arranged to slidably receive a second pair of slide rail members. The second pair of slide rail members slidably receive a third pair of slide rail members. The third slide rail members are connected to a fourth pair of slide rail members. The fourth slide rail members are fixed to the tray. Conventional stop means are provided to prevent detachment of the first, second and third slide rail members. The third and fourth slide rail members are pivotally connected to one another.

The third and fourth slide rail members are connected by a lockable pivoting connection. The connection allows for a first position in which the third and fourth slide rail members are parallel to one another and the tray is maintained parallel to the frame such that it may be slidable received thereby. The connection further allows for at least one further position in which the third and fourth slide rail members are not parallel but are at an angle to one another following a rotational movement about the pivoting connections.

Most preferably this further position is perpendicular to the frame, as shown in FIGS. 4, 5 and 6. Rotational movement about the pivoting connections is only possible following relative sliding movement between the slide rails to bring the tray clear of the frame.

An arrangement may be provided, which features a locking mechanism that permits the tray to be locked relative to the frame at any desired angle between parallel and perpendicular.

The lockable pivoting connection may take any suitable form, as will be readily appreciated by those skilled in the art. In one possible arrangement, each of the fourth slide rails is provided with a pair of spaced lugs that are arranged to be received in respective first and second slots provided in a respective one of the third slide members. The first slot is closed and extends parallel to the longitudinal axis of the third slide member and the second slot is open at its upper end and extends substantially perpendicular to the first slot. By such arrangement, when each pin is located in its respective slot, the third and fourth slide rail members are maintained parallel to one another. With the second pin removed from the second slot the third and fourth slide rail members may be pivoted relative to one another, which allows the tray to be brought perpendicular to the frame, as shown in FIGS. 4 to 6.

Pivotal movement between the third and fourth slide rail members is effected as follows:
1) the fourth slide rail is pivoted relative to the third slide rail about the first pin (which is held in the first, closed, slot) to remove the second pin from the second, open, slot;
2) the fourth slide rail member is slid relative to the third slide rail member (with the first pin travelling in the first, closed, slot) until the second pin is clear of the third slide rail member; and
3) the third and fourth rail members are pivoted relative to one another to bring the fourth slide rail member perpendicular to the third slide rail member (and thereby to bring the tray perpendicular to the frame, as illustrated in FIGS. 4 to 6).

The tray is provided with a front face, which is preferably substantially vertical when the module is in the first position, and which is preferably provided with a handle 4, as shown in the figures, which may be grasped by a user to effect sliding and pivotal movement.

The tray comprises an upper face, which, as shown in the Figures is arranged to lie parallel to the plane of the frame, when the tray is in the first position, and to lie at an angle to the plane of the frame (most preferably perpendicular, as shown in FIGS. 4 to 6) and to face outwards from the frame, when the tray is in the second position. The tray is arranged such that electronic components mounted within the tray are accessible from the upper face.

This is an important aspect of the present invention, which allows an increased density of removable/serviceable components and, moreover, easy access.

In the depicted embodiment, the module is arranged as a hard disk array, which features a plurality of compartments 6 (48 compartments are provided in the depicted arrangement), each of which is provided to removably support a hard disk drive that may be inserted and removed through the upper face of the tray, which upper face may be angled for easy access by pivoting the tray, as discussed above and depicted in FIGS. 4 to 6. The hard drives of the array are preferably arranged to be hot swappable in the normal manner, as will be understood by the skilled person. The hard disk drives may be provided in casings that are arranged to be received by the compartments. The tray is arranged so that the necessary data and power connections are provided in each compartment.

It should be appreciated, however, that the present invention is not limited to hard disk arrays.

Whilst the module described above comprises a frame for receiving a single tray, it is possible that more than one tray will be received by each frame. Frames may be arranged to receive two or more trays is a side by side and/or stacked arrangement.

As will be readily appreciated by those skilled in the art, alternative configurations of the rack are possible. For example, alternative sliding/pivoting mechanisms will be readily envisaged by the person skilled in the art.

Referring to FIGS. 7 to 23, there are shown further rack modules according to the invention. In some Figures, rack modules 11 according to the invention can be seen in use in a rack 10, to provide a rack unit.

Figure 12:
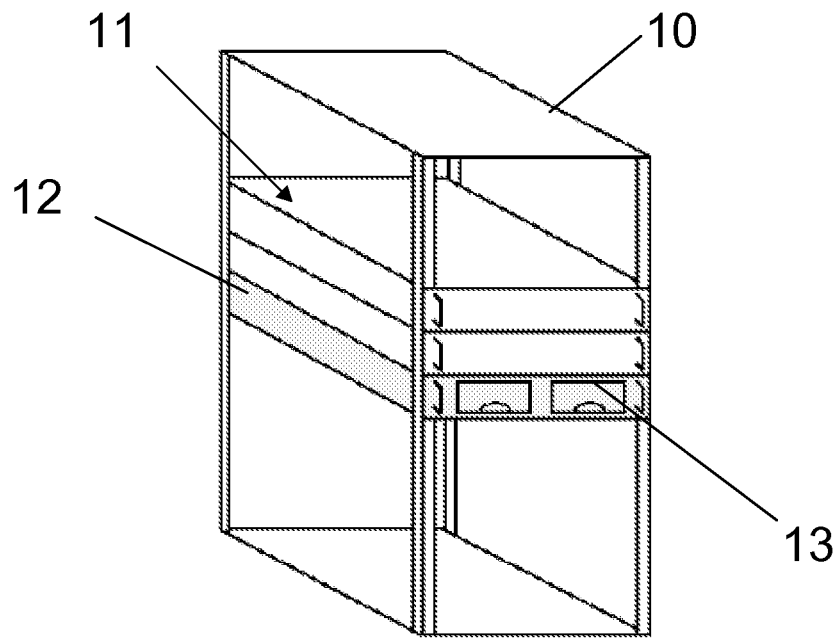
FIG. 12 shows a rack unit which comprises a rack containing rack modules of the invention, with the trays in the closed position.
Figure 17:
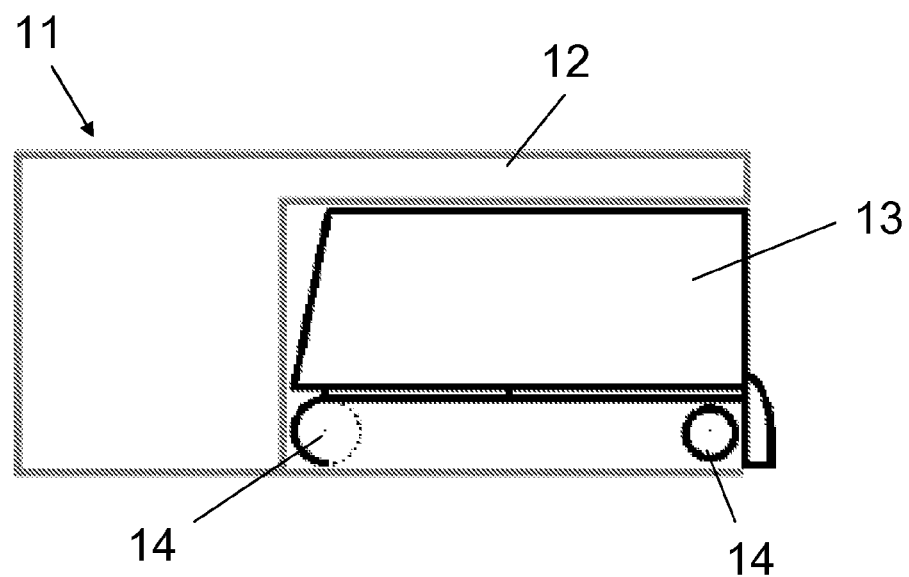
FIG. 17 shows a side view of a fifth embodiment of the rack module in a position where the tray is in the closed position.
Figure 18:
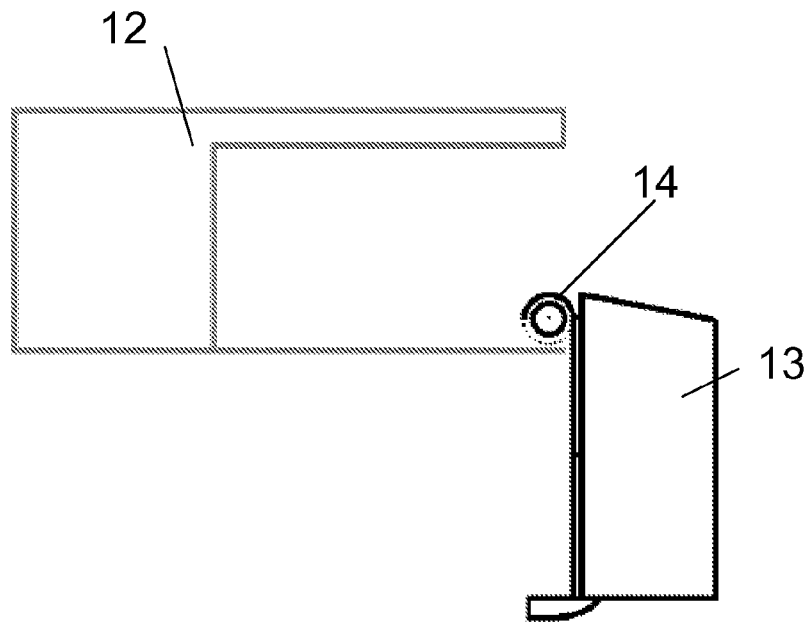
FIG. 18 shows a side view of the fifth embodiment of the rack module in a position where the tray has been slid out and pivoted into the open position.
Figure 19:
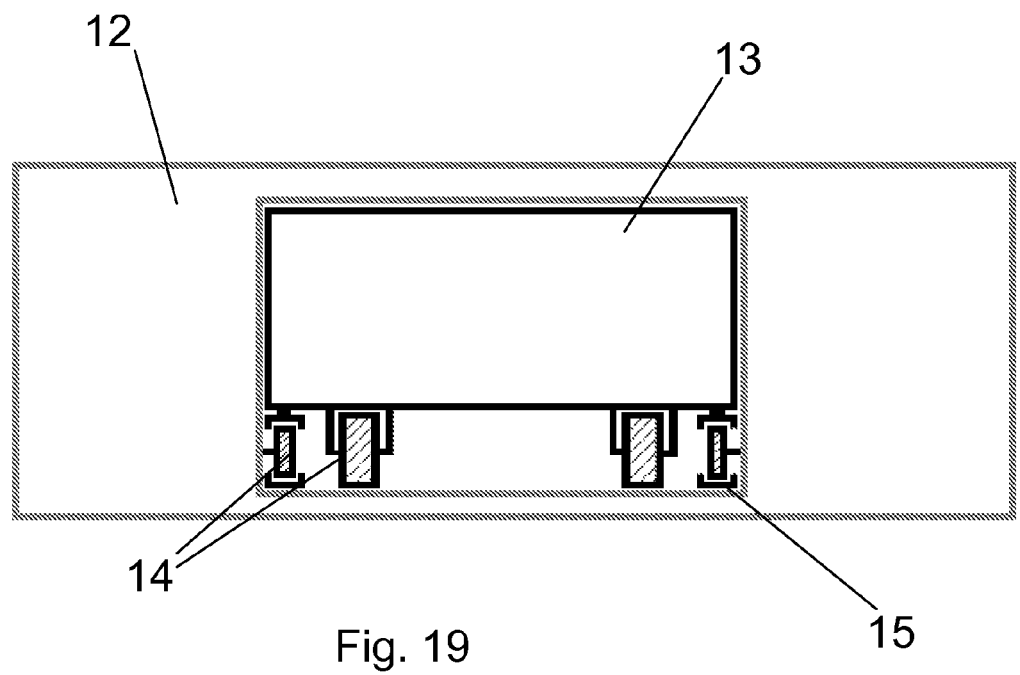
FIG. 19 shows a front view of the fifth embodiment of the rack module.

The rack module 11 comprises a frame 12 and a tray 13. The frame is arranged such that it may be mounted within a rack 10. The tray is slidably and pivotably mounted to the frame, such that the tray may be moved between a first, closed, position (as shown in FIGS. 12 and 17) and a second, open, position (as shown in FIGS. 7, 9, 11, 13, 15, 18 and 21). It can be seen from FIGS. 8, 10, 14 and 20 that the tray moves between the first and second positions via a position where the tray has been partially or fully slid out of the frame but not pivoted.

In the first position, the tray is received within the frame and lies substantially parallel to the frame, which is preferably mounted in the rack such that it is horizontal in use. In the second position, the tray lies outside the frame and at an angle to the frame. It can be seen that in the second position the tray may lie perpendicular to the frame (as in FIGS. 7, 11, 13, 15, 18, 21), however, in alternative embodiments, it may be arranged to lie at an oblique angle to the frame (as in FIG. 9).

The tray may be arranged such that it may be locked at a range of angles between an extended parallel position and the perpendicular position or other position outside the frame and at an angle to the frame.

Figure 9:
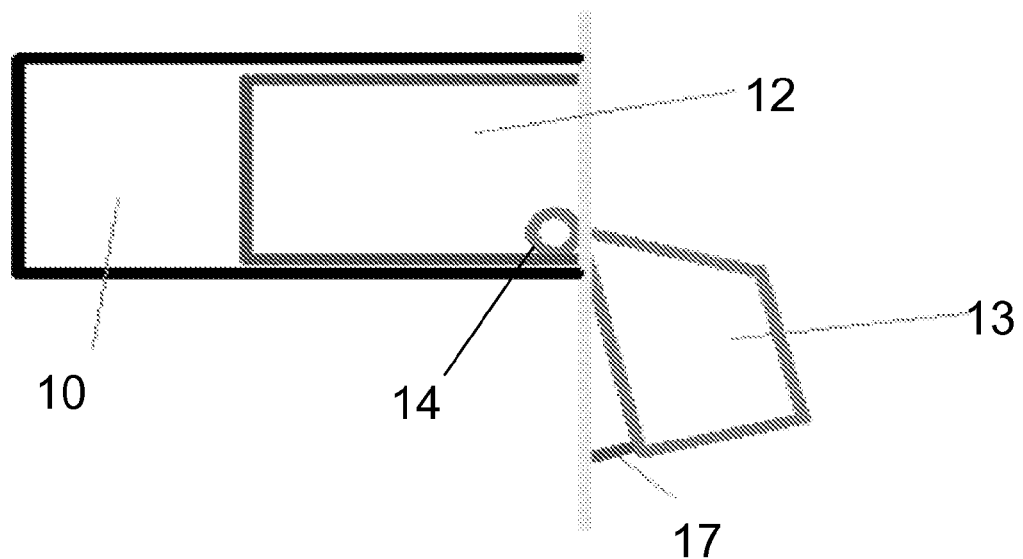
FIG. 9 shows a side view of the second embodiment of the rack module in a position where the tray has been slid out and pivoted into the open position.
Figure 10:
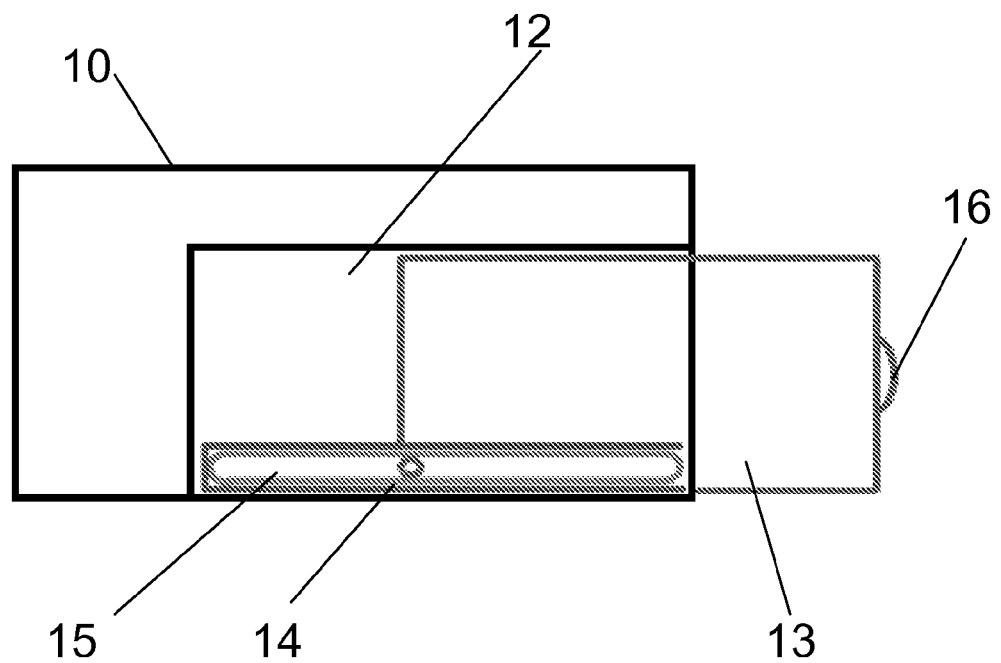
FIG. 10 shows a side view of a third embodiment of the rack module in a position where the tray has been partially slid out but not pivoted.
Figure 11:
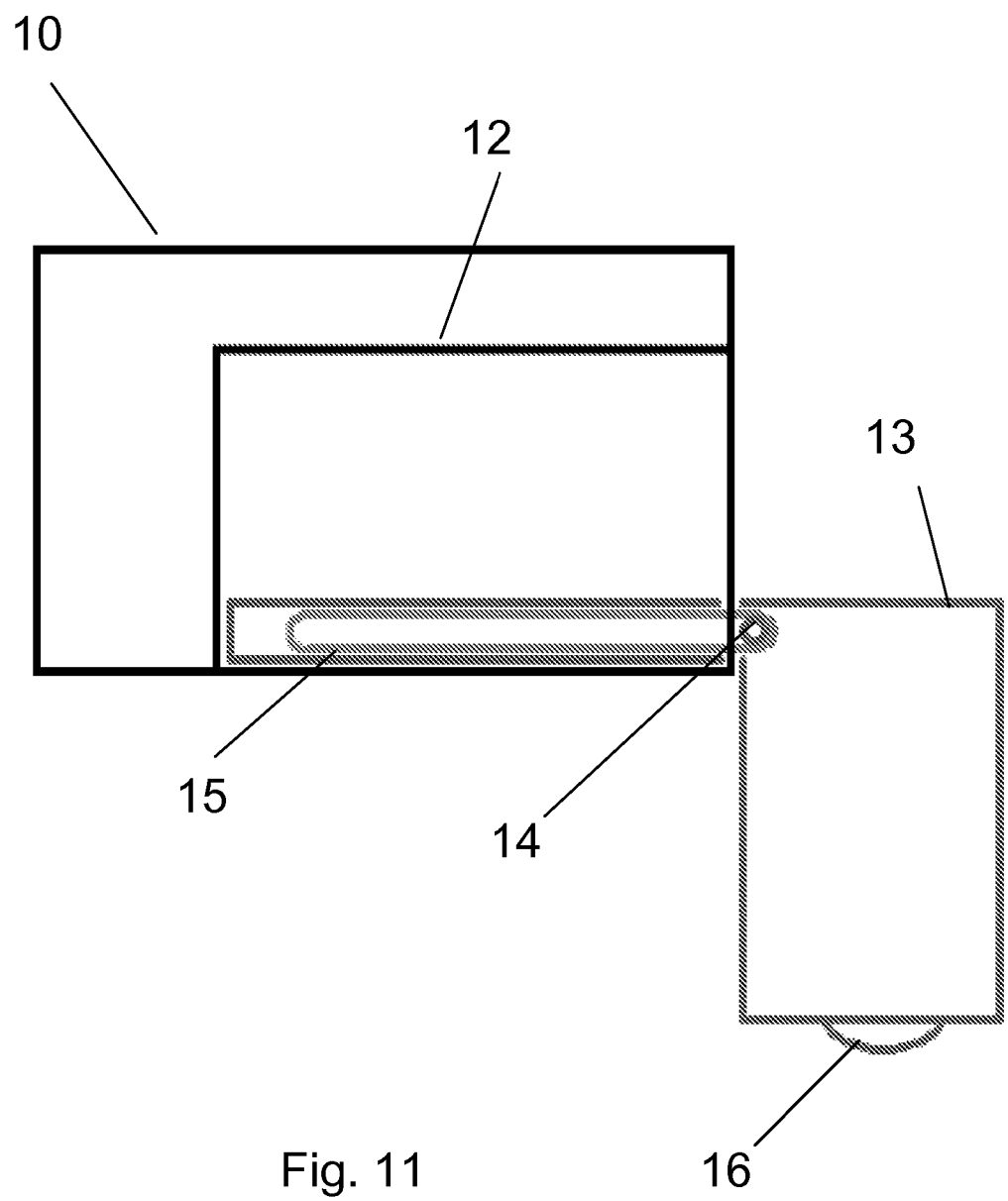
FIG. 11 shows a side view of the third embodiment of the rack module in a position where the tray has been slid out and pivoted into the open position.

A leg 17 may be provided on the tray (as shown in FIG. 9). The leg may be located such that when the tray is in its second position the leg contacts an outer surface of the rack. As can be seen in FIG. 9, the leg may extend from the bottom surface of the tray, being located at or near to the front face of the tray.

The leg can be used to prevent the tray from accidentally hitting anything behind it. The leg may be used to slightly angle the tray when it is in the second position, as shown in FIG. 9.

The frame is preferably arranged to fit within a standard 19 inch frame rack. Frames, and thereby trays, of various depths are possible. The depth of the frame will be largely dependent on the components that the tray is arranged to receive. To conform to the 19 inch rack standard, the frame will have a minimum depth of 1 U (1.75 inches (44.5 mm)). It may, however, have a depth of multiple Us, i.e. 2 U, 3 U, 4 U, etc.

The frame is preferably provided with edges or ears (not shown) that protrude on its vertically extending front side edges to allow the module to be fastened to a rack with fastening means such as screws or the like in the conventional manner.

The frame may take any suitable form that allows it to be retained within a rack and to slidably and rotatably receive the tray. The frame, as depicted, is preferably substantially rectangular.

The frame, as discussed, receives the tray and the tray is slidably and pivotably connected to the frame.

The tray may move slidably out of the frame, and slidably back into the frame, by the use of any sliding mechanism. The FIGS. 7-11 and 14-22 show various suitable sliding mechanisms, although these are not limiting. It can be seen that the sliding mechanism is preferably located on the bottom surface of the tray and/or on the inside of the frame for engagement with the bottom surface of the tray.

Preferably the sliding mechanism involves the provision of bearing means 14, such as wheels, castors, rollers or the like. These are provided on the bottom surface of the tray and/or on the inside of the frame for engagement with the bottom surface of the tray. The Figures show the bearing means as wheels but it will be appreciated that this is not the only workable option for the bearing means.

Preferably the sliding mechanism includes guide means 15 to assist the sliding of the tray. These may be rails or grooves or tracks or the like. The Figures show the guide means as tracks or slide rails but it will be appreciated that this is not the only workable option for the guide means.

The tray may pivot with respect to the frame by the use of any pivoting mechanism. It is preferred that the pivoting mechanism involves pivoting about a bearing means 14, such as a wheel, castor, roller or the like.

Figure 8:
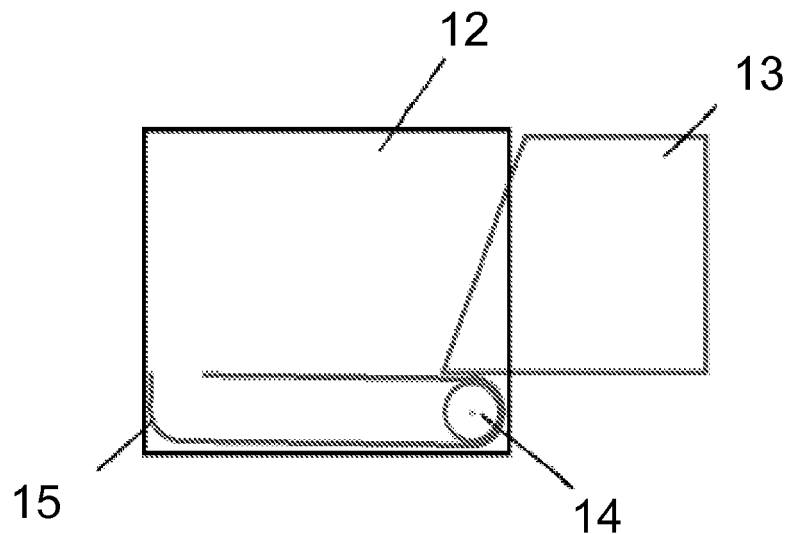
FIG. 8 shows a side view of the second embodiment of the rack module in a position where the tray has been slid out but not pivoted.

Preferably the position of the pivot 14 is either vertically aligned with or behind the back edge of the top surface of the tray (see for example FIGS. 8/9 and 14/15). In one embodiment the position of the pivot is at the back edge of the bottom surface of the tray.

In one embodiment the tray is connected to the frame via slide rails, which permit a sliding movement between the tray and the frame, i.e. reciprocal motion in the plane of the frame with the tray and the frame parallel to one another, and a pivotal movement between the tray and the frame, i.e. rotary motion to place the tray at an angle to the plane of the frame. The arrangement is such that pivotal movement is only possible once the tray has been slid to lie outside the frame. Any suitable connecting mechanism may be implemented that permits such movement. In the figures, the connecting mechanism is shown as a wheel mechanism.

Rotational movement about the pivoting connections is only possible following relative sliding movement in respect of the guide means, to bring the tray clear of the frame.

As discussed above, an arrangement may be provided that features a locking mechanism that permits the tray to be locked relative to the frame at any desired angle between parallel and perpendicular. The lockable pivoting connection may take any suitable form, as will be readily appreciated by those skilled in the art.

Figure 20:
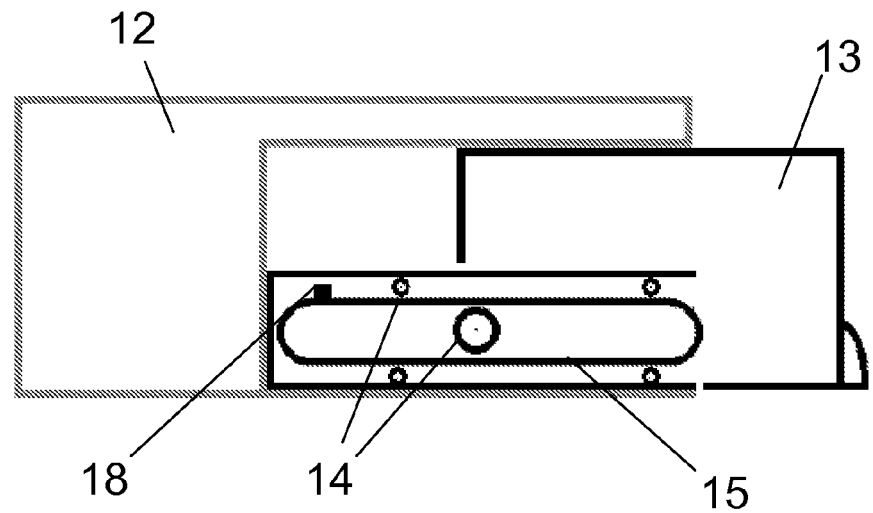
FIG. 20 shows a side view of a sixth embodiment of the rack module in a position where the tray has been partially slid out but not pivoted.
Figure 21:
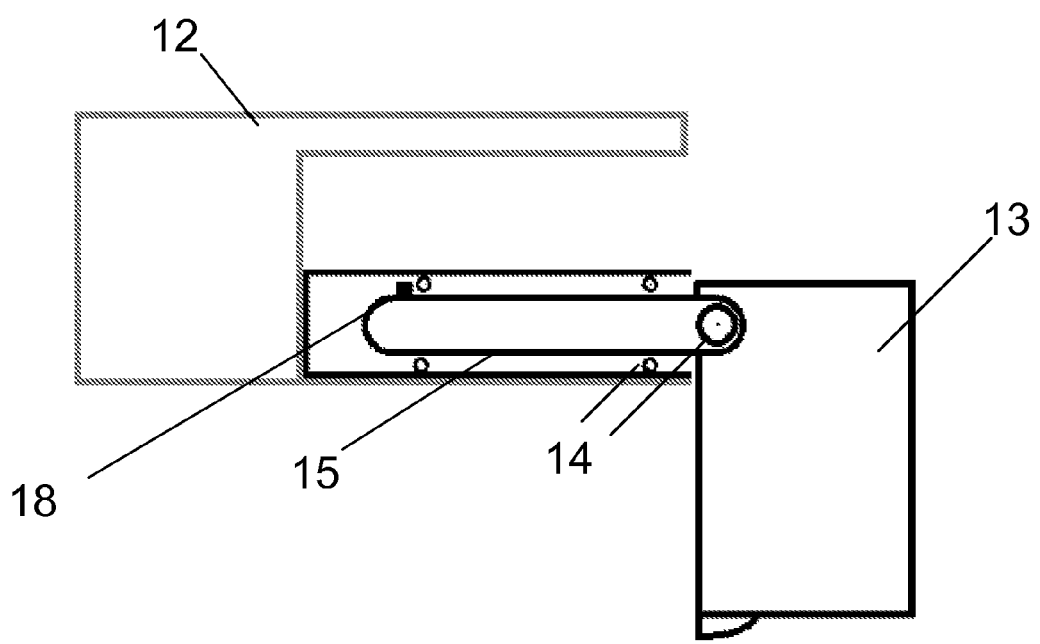
FIG. 21 shows a side view of the sixth embodiment of the rack module in a position where the tray has been slid out and pivoted into the open position.
Figure 22:
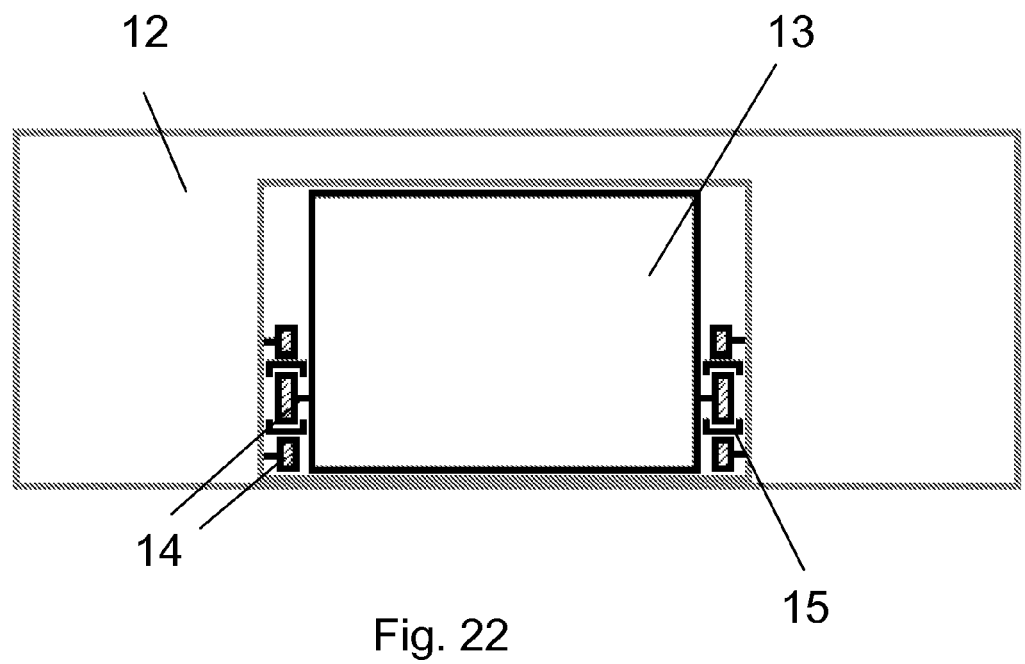
FIG. 22 shows a front view of the sixth embodiment of the rack module.
Figure 23:
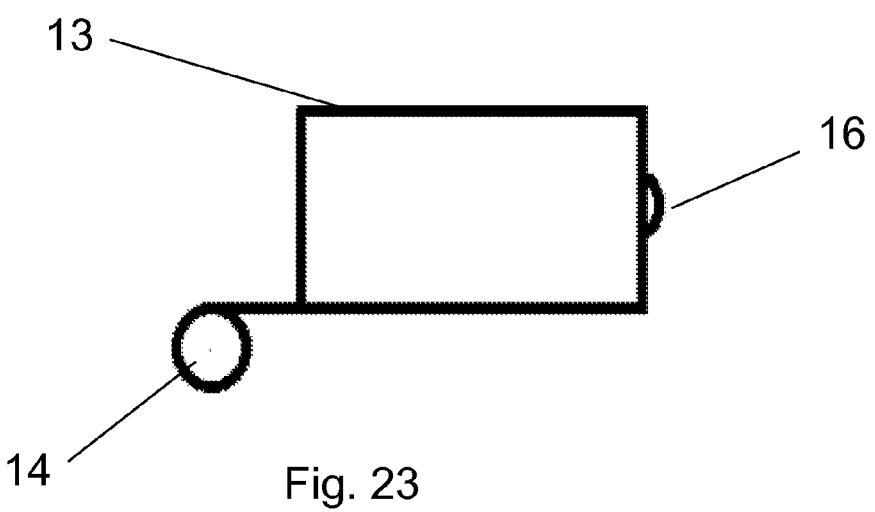
FIG. 23 shows a side view of a tray that can be used in the rack module, where the tray has a back face that is perpendicular rather than angled.

In some embodiments the sliding mechanism may include a stopper 18 as shown in FIGS. 20 and 21.

The module of the invention forms a closed box when the tray is in its first position, in which the tray is received within the frame and lies substantially parallel to the frame. As can be seen in the Figures, the tray is open at least on its upper face (which is beneficial in allowing access to the equipment provided in the tray) and the frame is open at least one end (allowing movement of the tray in and out of the frame, between the first and second positions) but when the tray and frame are combined, with the tray in its first position, the resultant module of the invention forms a closed box.

The tray is provided with a front face, which is preferably substantially vertical when the module is in the first position, and which is preferably provided with a handle 16, as shown in the figures, which may be grasped by a user to effect sliding and pivotal movement.

The tray comprises an upper face, which, as shown in the Figures is arranged to lie parallel to the plane of the frame, when the tray is in the first position, and to lie at an angle to the plane of the frame (most preferably perpendicular, as shown in FIGS. 4 to 6) and to face outwards from the frame, when the tray is in the second position. The tray is arranged such that electronic components mounted within the tray are accessible from the upper face.

This is an important aspect of the present invention, which allows an increased density of removable/serviceable components and, moreover, easy access.

Figure 13:
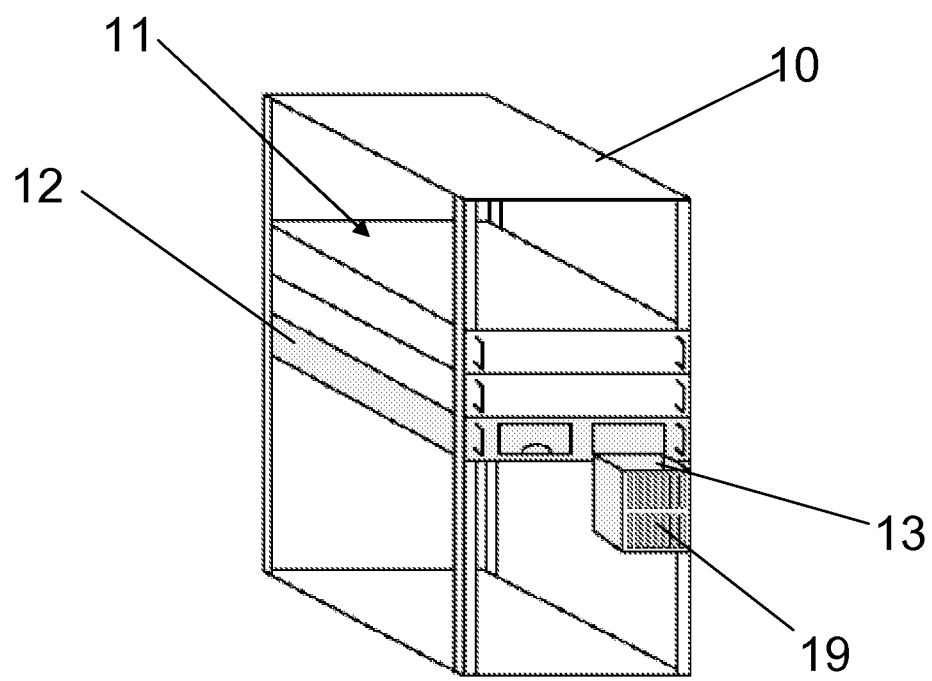
FIG. 13 shows a rack unit which comprises a rack containing rack modules of the invention, with one tray in the open position.
Figure 14:
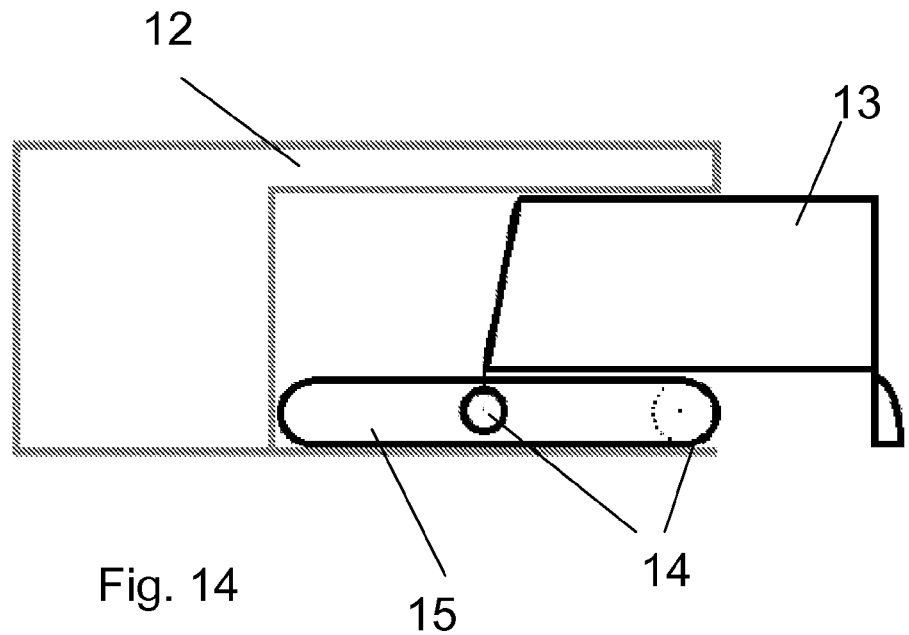
FIG. 14 shows a side view of a fourth embodiment of the rack module in a position where the tray has been partially slid out but not pivoted.
Figure 15:
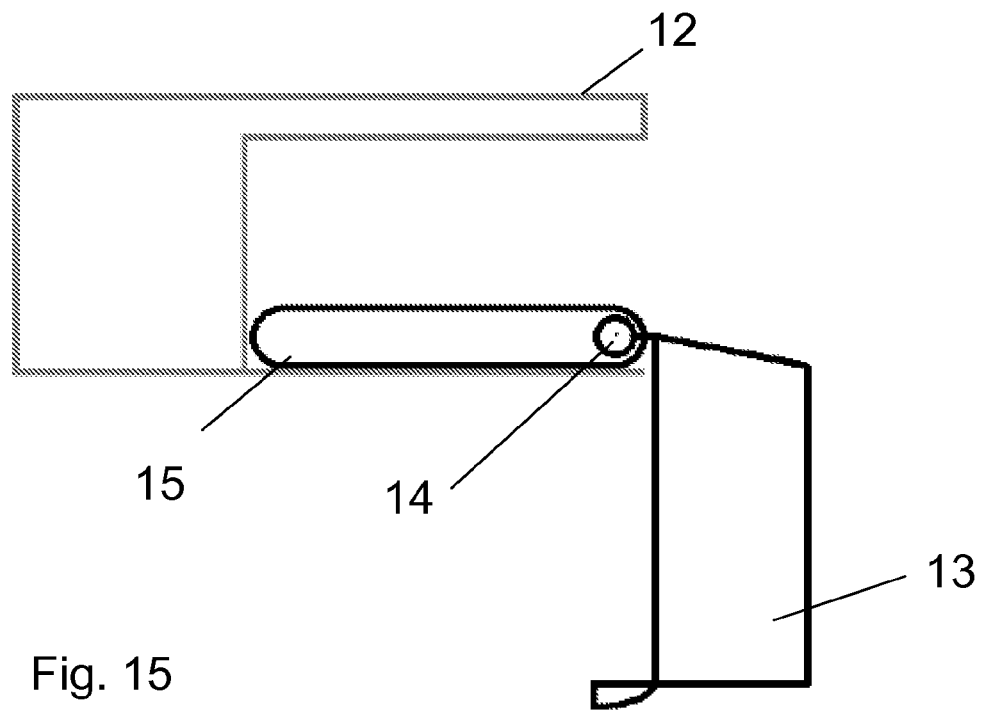
FIG. 15 shows a side view of the fourth embodiment of the rack module in a position where the tray has been slid out and pivoted into the open position.
Figure 16:
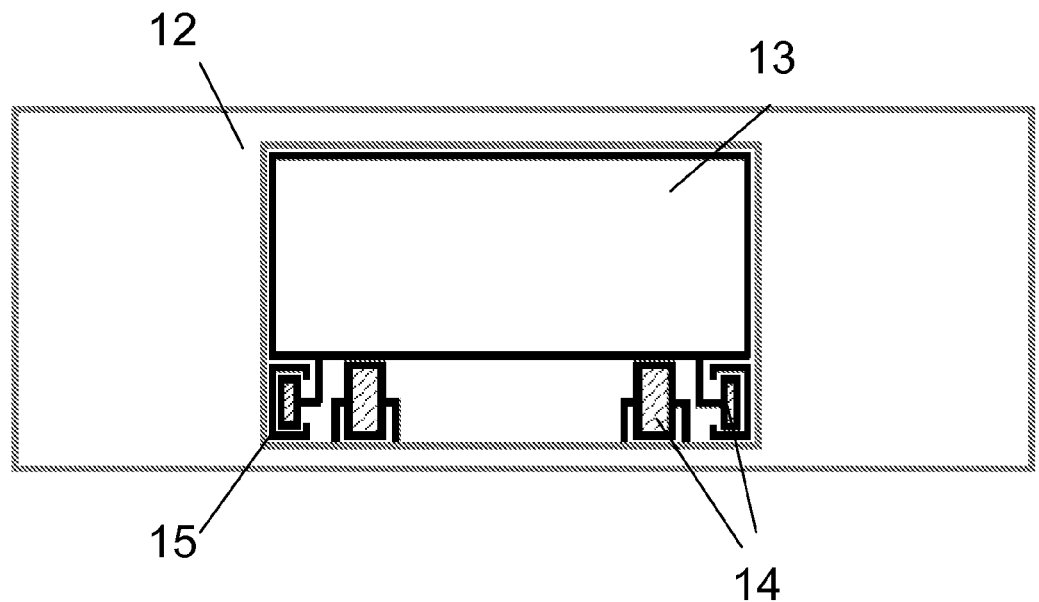
FIG. 16 shows a front view of the fourth embodiment of the rack module.

In FIGS. 12 and 13 the module is arranged as a hard disk array. The product shown in these Figures is a hard disk drive unit that comprises a rack 10 in accordance with the invention, wherein one or more of the modules 11 has hard disk drives 19 located in its tray 13.

The tray may include a plurality of compartments, each of which is provided to removably support a hard disk drive that may be inserted and removed through the upper face of the tray, which upper face may be angled for easy access by pivoting the tray, as discussed above.

The hard drives of the array are preferably arranged to be hot swappable in the normal manner, as will be understood by the skilled person. The hard disk drives may be provided in casings that are arranged to be received by the compartments. The tray is arranged so that the necessary data and power connections are provided in each compartment.

It should be appreciated, however, that the present invention is not limited to hard disk arrays.

Whilst the modules described and shown comprise a single frame for receiving a single tray or two trays, it is possible that other numbers of trays can be received by each frame. Whilst FIGS. 12 and 13 show an embodiment where two trays are provided in a side by side arrangement, it will be understood that frames may be arranged to receive two or more trays (e.g. three or more or four or more trays) in a side by side and/or stacked arrangement.

As will be readily appreciated by those skilled in the art, alternative configurations of the rack are possible. For example, alternative sliding/pivoting mechanisms will be readily envisaged by the person skilled in the art.

The invention claimed is:

1. A module for mounting in a rack, the module comprising a frame and a plurality of trays mounted to the frame, the frame being arranged such that it may be mounted to the rack;
   wherein the plurality of trays are connected to the frame such that each one of the plurality of trays is independently moveable between a first position and a second position;
   wherein in the first position the tray is received within the frame such that an open face of the tray is inaccessible; and
   wherein in the second position the tray lies outside the frame and at an angle to the frame such that the open face is accessible to permit an electronic component to be added, removed, or exchanged through the open face.

2. The module of claim 1,
   wherein the open face is arranged to face outwards from the frame when the tray is in the second position.

3. The module of claim 1, wherein one or more of the plurality of trays is arranged such that, in the second position, the tray lies perpendicular to the frame.

4. The module of claim 1, wherein
   the electronic component includes hot swappable electronic components.

5. The module of claim 1, wherein the module is a hard drive array.

6. The module of claim 1, wherein one or more of the plurality of trays are configured to removably support the electronic component.

7. The module of claim 6, wherein the electronic component is a hard drive.

8. The module of claim 1, wherein the frame is at least one of:
arranged to be mounted in a 19 inch rack; and
characterized by a height of one of 1 U or a multiple of 1 U.

9. The module of claim 1, wherein the module forms a closed box when the trays are in their first position.

10. The module of claim 1, wherein one or more of the plurality of trays are configured to move relative to the frame using a bearing means.

11. The module of claim 1, wherein one or more of the plurality of trays pivot with respect to the frame about a horizontal pivot axis that is either vertically aligned with or behind a back edge of a top surface of the tray.

12. The module of claim 1, wherein the plurality of trays includes two trays arranged side-by-side in the frame.

13. The module of claim 1, wherein the trays comprise a data connection for the electronic component.

14. The module of claim 1, wherein the module comprises a power connection for the trays.

15. The module of claim 1, wherein the module comprises a data connection for the trays.

16. The module of claim 1, wherein one or more of the plurality of trays pivot with respect to the frame about a horizontal pivot axis that is outside the frame and aligned to, or proximate to, a center of the tray.

17. The module of claim 1, further comprising a locking mechanism configured to restrict motion of one or more of the plurality of trays relative to the frame.

18. A rack unit comprising a rack provided with one or more modules for mounting in the rack;
wherein each module comprises a frame and a plurality of trays mounted to the frame, the frame being arranged such that it may be mounted to the rack;
wherein the plurality of trays are connected to the frame such that each one of the plurality of trays is independently moveable between a first position and a second position;
wherein in the first position the tray is received within the frame such that an open face of the tray is inaccessible; and
wherein in the second position the tray lies outside the frame and at an angle to the frame such that an open face of the tray is accessible to permit an electronic component to be added, removed, or exchanged through the open face.

19. The rack unit of claim 18, wherein the rack comprises one or more cavities within which the one or more modules can fit.

20. The rack unit of claim 19, wherein the one or more modules are mounted in each of the one or more cavities.

21. The rack unit of claim 19, wherein the cavities each have a height that is a multiple of 1 U.

22. The rack unit of claim 18, wherein the one or more of the modules includes a hard drive located in its tray.

* * * * *